(12) United States Patent
Duan et al.

(10) Patent No.: US 11,448,837 B2
(45) Date of Patent: Sep. 20, 2022

(54) ANTI-CROSS-LIGHTING STRUCTURE

(71) Applicant: DONGGUAN LUXSHARE TECHNOLOGIES CO., LTD, Dongguan (CN)

(72) Inventors: Baiyu Duan, Dongguan (CN); Zhen Luo, Dongguan (CN); Xiaokai Wang, Dongguan (CN); Xiaoping Wu, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 0 days.

(21) Appl. No.: 17/352,650

(22) Filed: Jun. 21, 2021

(65) Prior Publication Data

US 2022/0003943 A1 Jan. 6, 2022

(30) Foreign Application Priority Data

Jul. 6, 2020 (CN) .......................... 202021296089.8

(51) Int. Cl.
*G02B 6/42* (2006.01)
*H01R 13/717* (2006.01)

(52) U.S. Cl.
CPC ......... *G02B 6/4206* (2013.01); *G02B 6/4261* (2013.01); *G02B 6/4262* (2013.01); *H01R 13/7172* (2013.01); *H05K 2201/10121* (2013.01)

(58) Field of Classification Search
None
See application file for complete search history.

(56) References Cited

U.S. PATENT DOCUMENTS

| 7,601,021 | B1 * | 10/2009 | Yang | G02B 6/4261 |
| | | | | 439/487 |
| 7,621,773 | B2 * | 11/2009 | Bright | G02B 6/0008 |
| | | | | 439/490 |
| 8,823,540 | B2 * | 9/2014 | Scholeno | H04B 10/801 |
| | | | | 340/815.4 |
| 9,255,703 | B2 * | 2/2016 | Auyeung | G02B 6/0096 |
| 9,739,959 | B2 * | 8/2017 | Masahiko | G02B 6/4261 |

(Continued)

FOREIGN PATENT DOCUMENTS

| CN | 203942113 U | 11/2014 |
| CN | 206020711 U | 3/2017 |

(Continued)

*Primary Examiner* — Jerry Rahll
(74) *Attorney, Agent, or Firm* — Birch, Stewart, Kolasch & Birch, LLP

(57) ABSTRACT

The present disclosure discloses an anti-cross-lighting structure. The anti-cross-lighting structure includes a support frame, a plurality of light-guiding elements located beside the support frame, and a shielding piece mounted on the support frame. The light-guiding elements are arranged on a same side of the support frame and forms at least one group. The shielding piece wraps over the light-guiding elements. The shielding piece includes a number of middle blocking portions. Each middle blocking portion isolates the light-guiding elements which are adjacent to each other. The anti-cross-lighting structure of the present disclosure effectively avoids the cross-lighting phenomenon and also has a stable structure.

20 Claims, 17 Drawing Sheets

(56) References Cited

U.S. PATENT DOCUMENTS

| | | | | |
|---|---|---|---|---|
| 9,787,034 B2* | 10/2017 | Yang | | G02B 6/0008 |
| 9,933,555 B2* | 4/2018 | Henry | | G02B 6/008 |
| 10,667,423 B2* | 5/2020 | Morihata | | G02B 6/0008 |
| 10,890,715 B1* | 1/2021 | Hsieh | | G02B 6/0001 |
| 2005/0254772 A1* | 11/2005 | Long | | G02B 6/0008 |
| | | | | 385/146 |
| 2005/0255726 A1* | 11/2005 | Long | | H01R 13/518 |
| | | | | 439/80 |
| 2006/0003628 A1* | 1/2006 | Long | | H01R 12/716 |
| | | | | 439/541.5 |
| 2007/0155223 A1* | 7/2007 | Huang | | H01R 13/7172 |
| | | | | 439/490 |
| 2009/0258534 A1* | 10/2009 | Bright | | G02B 6/4246 |
| | | | | 439/490 |
| 2010/0111476 A1* | 5/2010 | Shirk | | H01R 13/7172 |
| | | | | 385/53 |
| 2012/0155108 A1* | 6/2012 | Scholeno | | G02B 6/4298 |
| | | | | 362/580 |
| 2015/0362167 A1* | 12/2015 | Auyeung | | F21V 29/71 |
| | | | | 362/555 |
| 2016/0308313 A1* | 10/2016 | Yang | | G02B 6/0008 |
| 2017/0214170 A1* | 7/2017 | Su | | G02B 6/4284 |
| 2017/0261674 A1* | 9/2017 | Henry | | G02B 6/0006 |
| 2019/0296493 A1* | 9/2019 | Liu | | G02B 6/0001 |
| 2019/0296502 A1* | 9/2019 | Liu | | H01R 12/58 |
| 2020/0366035 A1* | 11/2020 | Wu | | H01R 13/518 |

FOREIGN PATENT DOCUMENTS

| | | |
|---|---|---|
| CN | 107196151 A | 9/2017 |
| CN | 207352207 U | 5/2018 |
| CN | 108983349 A | 12/2018 |
| CN | 209198694 U | 8/2019 |
| TW | 201436393 A | 9/2014 |

\* cited by examiner

ANTI-CROSS-LIGHTING STRUCTURE

CROSS-REFERENCE TO RELATED APPLICATION

This patent application claims a priority of a Chinese Patent Application No. 202021296089.8, filed on Jul. 6, 2020 and titled "anti-cross-lighting structure", the entire content of which is incorporated herein by reference.

TECHNICAL FIELD

The present disclosure relates to a field of electronic products, in particular to an anti-cross-lighting structure.

BACKGROUNDING

Light-guiding elements are devices that transmit light with minimal loss from one light source to another point at a certain distance from the light source. Light-guiding elements are usually made of optical materials, such as acrylic resin, polycarbonate, epoxy resin, and glass. The light-guiding element is usually arranged on the housing of the electronic product, and is used to guide light emitted by the light source, so as to display the working status, output information, and/or lighting of the electronic product. Due to the limitation of internal space, the distance between several light sources is too small. When one of the light sources is on, light will cross to the light outlet of the other light source, forming a cross-lighting phenomenon, which may cause misreading, data errors or operating errors.

SUMMARY

An object of the present disclosure is to provide an anti-cross-lighting structure, which can prevent the occurrence of cross-lighting phenomenon.

In order to achieve the above object, the present disclosure discloses an anti-cross-lighting structure. The anti-cross-lighting structure includes a support frame, a plurality of light-guiding elements located beside the support frame, and a shielding piece mounted on the support frame. The light-guiding elements are arranged on a same side of the support frame and forms at least one group. The shielding piece wraps over the light-guiding elements. The shielding piece includes a number of middle blocking portions. Each middle blocking portion isolates the light-guiding elements which are adjacent to each other.

Compared with the prior art, the anti-cross-lighting structure of the present disclosure includes a shielding piece wrapping over the light-guiding elements. The shielding piece includes a middle blocking portion isolating the light-guiding elements which are adjacent to each other, thereby avoiding the occurrence of cross-lighting. Furthermore, the anti-cross-lighting structure of the present disclosure connects the light-guiding elements on the same side of the support frame into a whole via a beam assembly. Via the cooperation between the positioning pin and the positioning hole, the light-guiding element can be quickly and stably assembled on the support frame. The shielding piece can be fastened and stably assembled on the support frame, either by the shielding piece and the support frame are clamped to each other or by a fastener screwed into holes defined both on the shielding piece and the support frame. Therefore, the present disclosure effectively avoids the cross-lighting phenomenon, and can also achieve the effects of easy assembly, quick disassembly, and stable structure.

DETAILED DESCRIPTION

Figure 1:
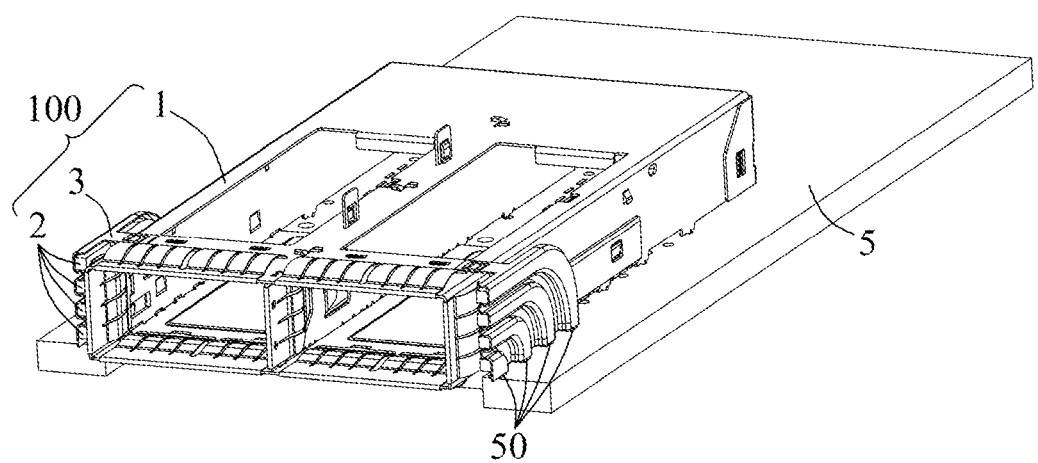
FIG. 1 is a perspective, assembled view of an anti-cross-lighting structure in accordance with a first embodiment of the present disclosure, which is mounted on a circuit board.

Referring to FIGS. 1 to 17, an anti-cross-lighting structure 100 of the present disclosure is installed on a circuit board 5 which is provided with at least one light source 50. The anti-cross-lighting structure 100 includes a support frame 1, a plurality of light-guiding elements 2 and a shielding piece 3. The support frame 1 is used to receive an electrical connector (not shown), the light-guiding element 2 is located beside the support frame 1, the shielding piece 3 is mounted on the support frame 1, and the shielding piece 3 is wrapping over the light-guiding element 2.

Figure 2:
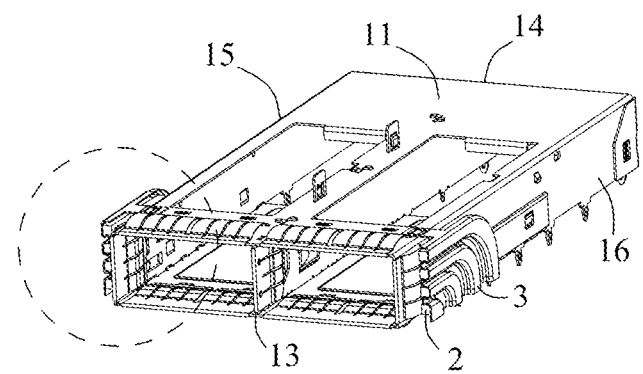
FIG. 2 is a perspective, exploded view of the anti-cross-lighting structure of the present disclosure and the circuit board where the anti-cross-lighting structure is mounted.
Figure 2:
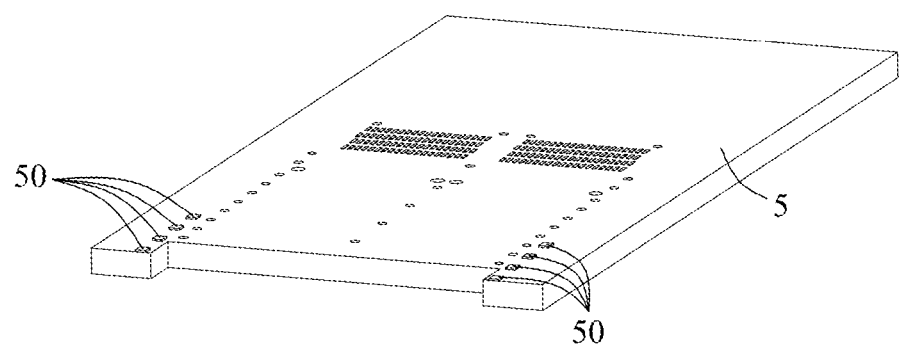
Figure 3:
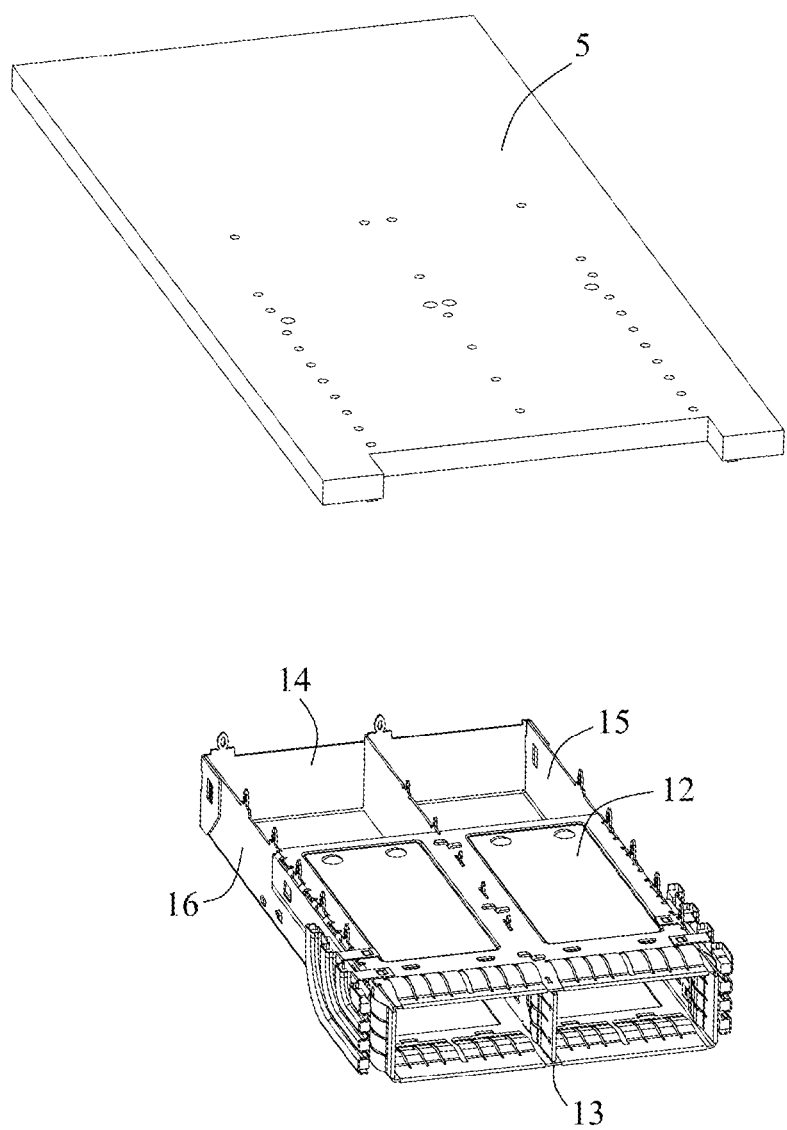
FIG. 3 is similar to FIG. 2 but taken a view from another angle.

Referring to FIGS. 2 and 3, the support frame 1 includes a top surface 11, a bottom surface 12, a front surface 13, a rear surface 14, a left surface 15 and a right surface 16. The top surface 11 and the bottom surface 12 are disposed opposite to each other, the front surface 13 and the rear surface 14 are disposed opposite to each other, and the left surface 15 and the right surface 16 are disposed opposite to each other, too. The front surface 13 faces a mating connector (not shown) for engagement and the bottom surface 12 faces the circuit board 5 for installation. The bottom surface 12 extend in a first plane and the front surface 13 extend in a second plane perpendicular to the first plane. The left surface 15 and the right surface 16 are located on two lateral sides of the front surface 13, and the left surface 15 and the right surface 16 extend in two third planes that are parallel to each other. The two third planes are perpendicular to both the bottom surface 12 and the front surface 13.

Figure 5:
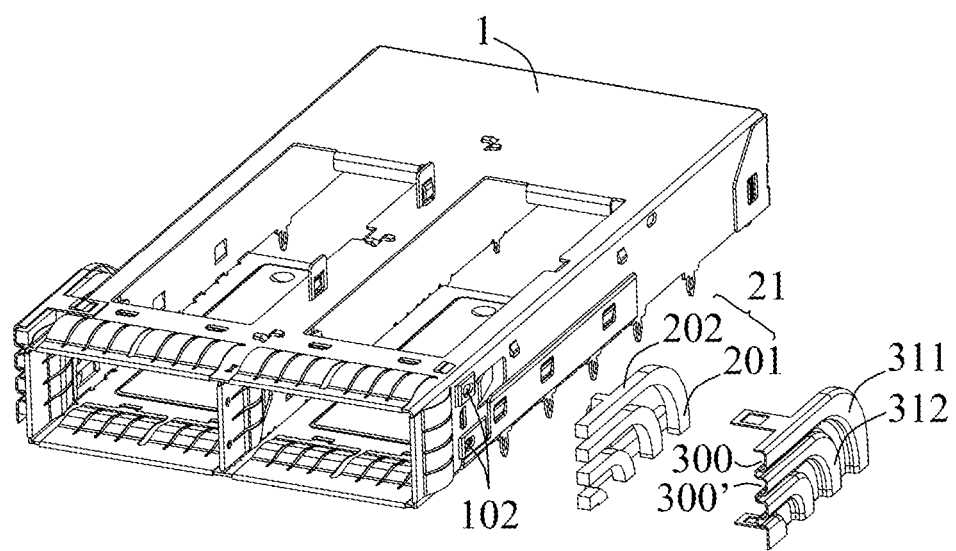
FIG. 5 is a perspective, further exploded view of the anti-cross-lighting structure.

Referring to FIGS. 1, 2, and 5, each light-guiding element 2 includes a first end portion 201 and a second end portion 202 bending from the first end portion 201. The first end portion 201 extends toward the bottom surface 12 and the second end portion 202 extends toward the front surface 13, that is, each light-guiding element 2 is curved. The first end portion 201 can be connected to the light sources 50 which are assembled on the bottom surface 12. Therefore, the light-guiding element 2 transmits light from the bottom surface 12 to the front surface 13 through the first end portion 201 and the second end portion 202, so as to display the working status, output information, lighting of the electrical connector and etc.

Figure 13:
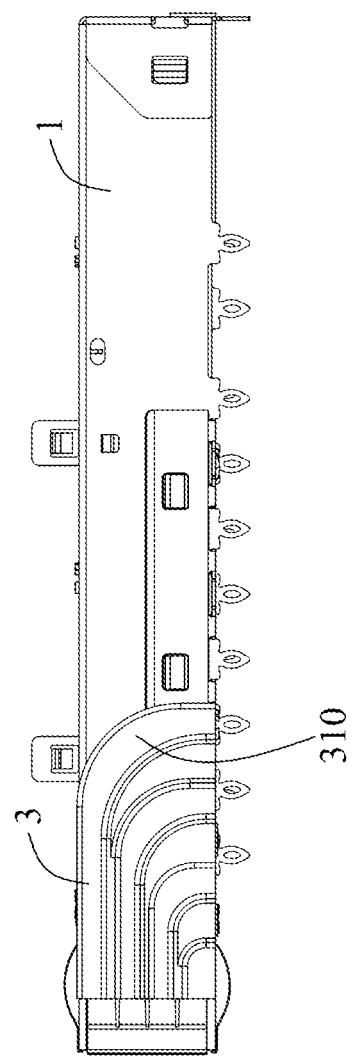
FIG. 13 is a right side view of the anti-cross-lighting structure of the present disclosure.
Figure 14:
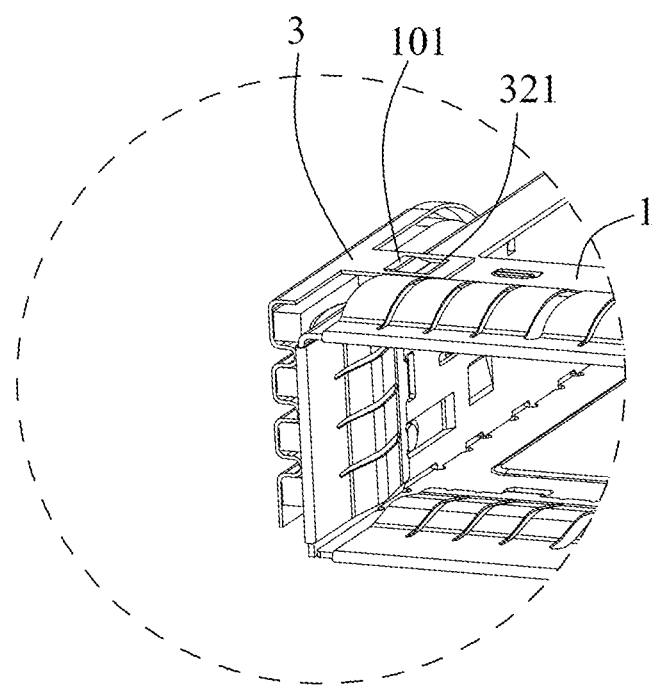
FIG. 14 is a partial enlarged view of FIG. 2.

Referring to FIGS. 1 to 15, in a preferred embodiment, the light-guiding elements 2 comprise two groups symmetrically arranged on the left and right surfaces 15 and 16 of the support frame 1. The shielding piece 3 should be two sheets arranged symmetrically on the left and right of the support frame 1, corresponding to the two groups of the light-guiding elements 2. In other embodiment which is shown in FIGS. 13 and 14, the light-guiding element 2 may also be arranged on only one of the left and right surfaces 15 and 16. Accordingly, the shielding piece 3 can be only one sheet corresponding to the only one group of the light-guiding elements 2. That is, in the anti-cross-lighting structure 100 of the present disclosure, the light-guiding elements 2 are arranged on at least one of the left and right surfaces 15 and 16. The shielding piece 3 comprises at least one sheet corresponding to numbers of groups of the light-guiding elements 2. Whether it is arranged on one side or on both sides can be selected according to the arrangement of the light sources 50 on the circuit board 5. In a preferred embodiment, the light sources 50 are arranged in two rows on the circuit board 5 and are symmetrically located on the left and right sides of the support frame 1.

Referring to FIGS. 4 to 7, the shielding piece 3 includes a main portion 31 and a pair of arm portions 32 extending from two ends of the main portion 31. The main portion 31 is formed with a plurality of curved surrounding structures 310 corresponding to the light-guiding elements 2. The arm portions 32 are fixed with the top surface 11 and the bottom surface 12 of the support frame 1, so that the shielding piece 3 can be assembled to the support frame 1.

Figure 4:
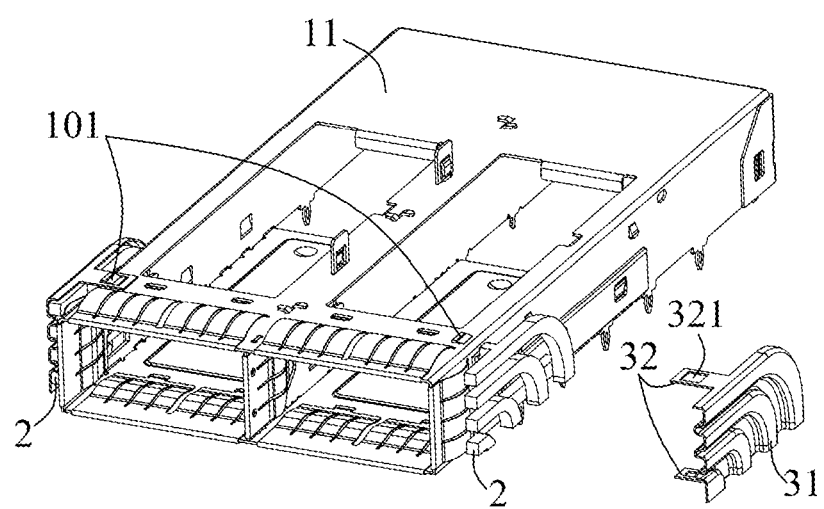
FIG. 4 is a perspective, exploded view of the anti-cross-lighting structure.
Figure 15:
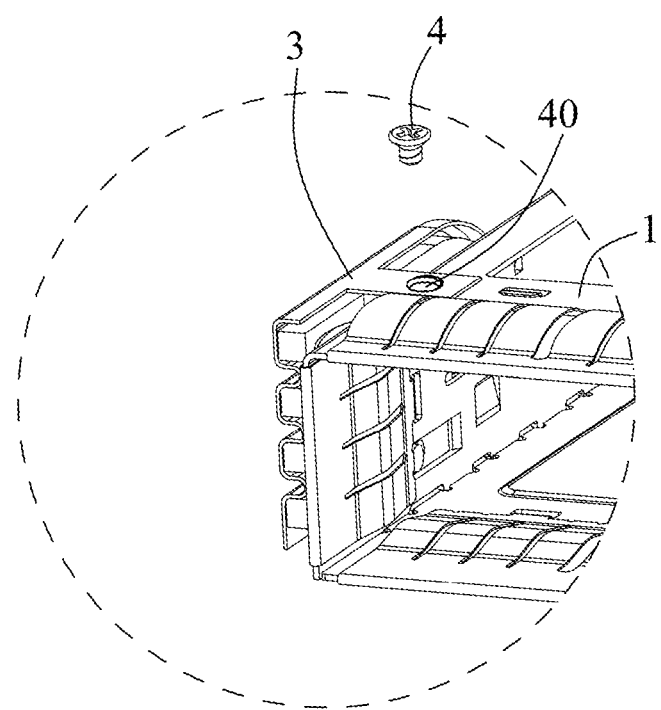
FIG. 15 is a partial enlarged view of the anti-cross-lighting structure similar to FIG. 14, in accordance with a second embodiment of the present disclosure.
Figure 16:
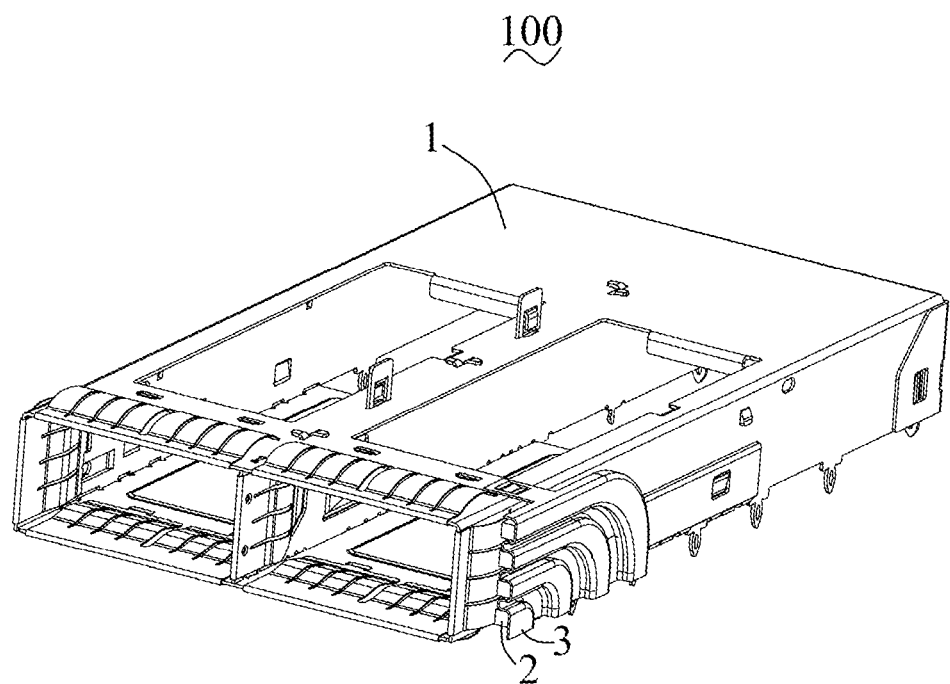
FIG. 16 is a perspective, assembled view of the anti-cross-lighting structure in accordance with the second embodiment of the present disclosure.
Figure 17:
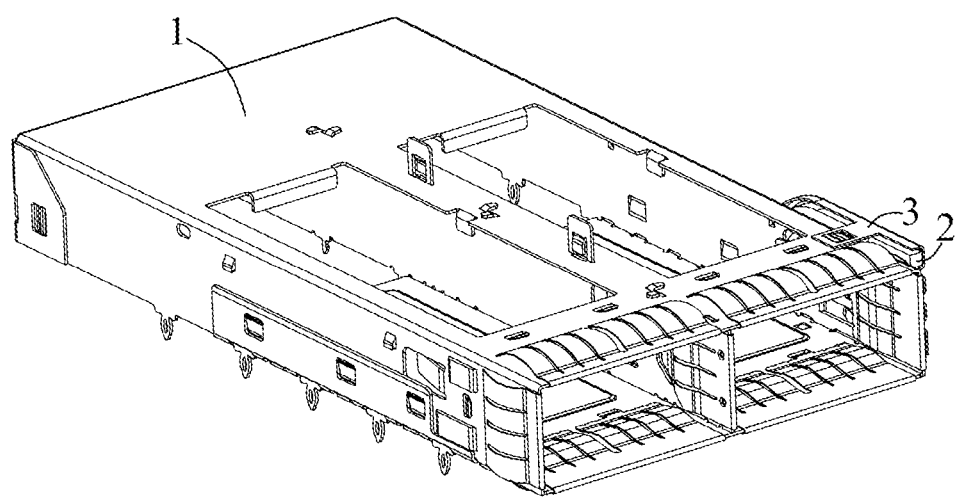
FIG. 17 is similar to FIG. 16 but taken a view from another angle.

Referring to FIG. 2, FIG. 4 and FIG. 14, the support frame 1 is provided with an engaging portion 101. The arm portion 32 is provided with a mating portion 321 for clamping with the engaging portion 101. Specifically, the engaging portion 101 is one of a protrusion and a slot, and the mating portion 321 is the other of the protrusion and the slot. In other embodiment which is shown in FIG. 15, the anti-cross-lighting structure 100 of the present disclosure further includes a fastener 4. Each of the arm portion 32 and the support frame 1 is provided with a through hole 40. The fastener 4 passes the through holes 40 of the arm portion 32 and the support frame 1 to fix the shielding piece 3 on the support frame 1. Specifically, the fastener 4 is a screw, and the through hole 40 is a threaded hole. By either of the above two methods, the shielding piece 3 can be quickly and stably assembled to the support frame 1.

Figure 6:
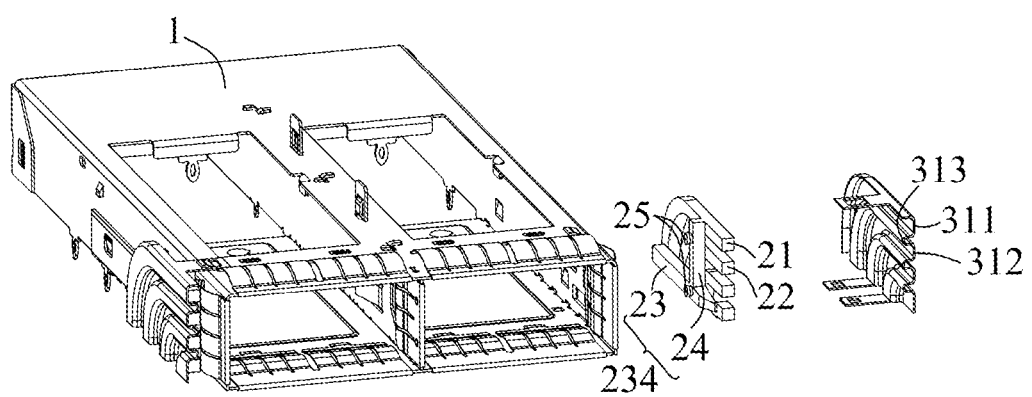
FIG. 6 is similar to FIG. 5 but taken a view from another angle.

Referring to FIG. 5 and FIG. 6, the light-guiding elements 2 on the same side of the support frame 1 are arranged in parallel. The anti-cross-lighting structure 100 of the present disclosure further includes a first beam 23 and a second beam 24. The light-guiding elements 2 on the same side of the support frame 1 are connected as a whole through the first beam 23 and the second beam 24 interlaced with each other. The first beam 23 and the second beam 24 may be collectively referred to as a beam assembly 234, but the beam assembly 234 includes but is not limited to a manner in which the first beam 23 and the second beam 24 are interlaced with each other. The beam assembly 234 is provided with a plurality of positioning pins 25, and the support frame 1 is provided with a plurality of positioning holes 102. Of course, the positioning pins 25 and the positioning holes 102 can also exchange positions. That is, the positioning pins 25 are located on the support frame 1, and the positioning holes 102 are located on the beam assembly 234. Via the cooperation of the positioning pins 25 and the positioning holes 102, the light-guiding elements 2 located on the same side of the support frame 1 are connected as a whole, which is called the same group of light-guiding elements 2. The same group of light-guiding elements 2 can be quickly and stably assembled on the support frame 1.

Referring to FIGS. 6 to 9, the light-guiding elements 2 on the same side include a first light-guiding pillar 21 and a second light-guiding pillar 22 spaced to the first light-guiding pillar 21. Correspondingly, each curved surrounding structure 310 includes a first surrounding portion 311 for accommodating the first light-guiding pillar 21 and a second surrounding portion 312 for accommodating the second light-guiding pillar 22. The number of the light-guiding elements 2 on the same side is not limited to two, and is four in the specific implementation. Similarly, the number of the curved surrounding structures 310 on the same side is not limited to two, and is four in the specific implementation. The main portion 31 includes a middle blocking portion 313 protruding between every two side-by-side light-guiding elements 2, i.e., the middle blocking portion 313 is located between the first light-guiding pillar 21 and the second light-guiding pillar 22. Therefore, the middle blocking portion 313 can separate the light-guiding elements 2 which are adjacent to each other to prevent cross-lighting.

Figure 7:
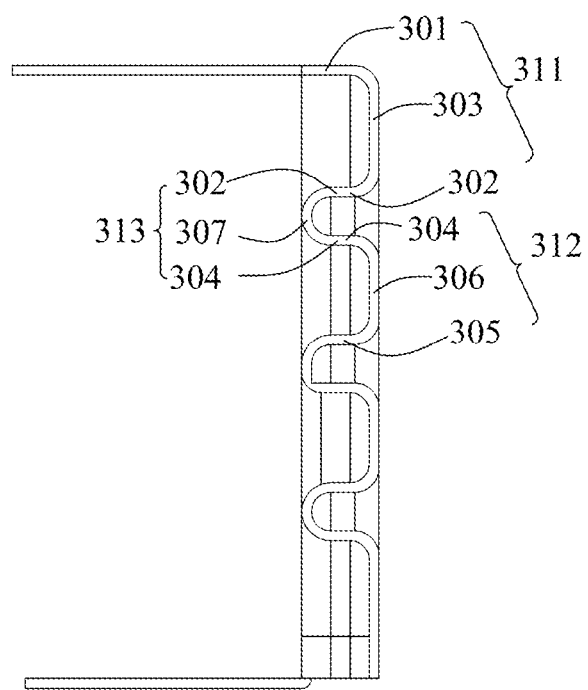
FIG. 7 is the front view of a shielding piece in the anti-cross-lighting structure of the present disclosure.
Figure 8:
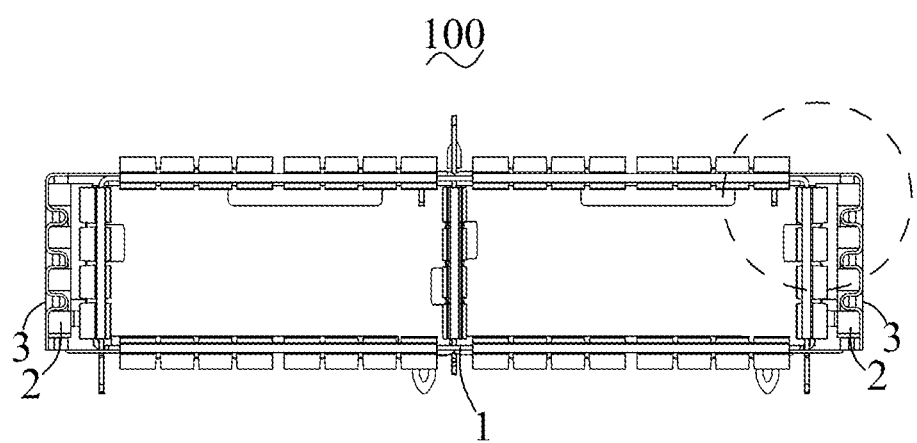
FIG. 8 is the front view of the anti-cross-lighting structure of the present disclosure.
Figure 9:
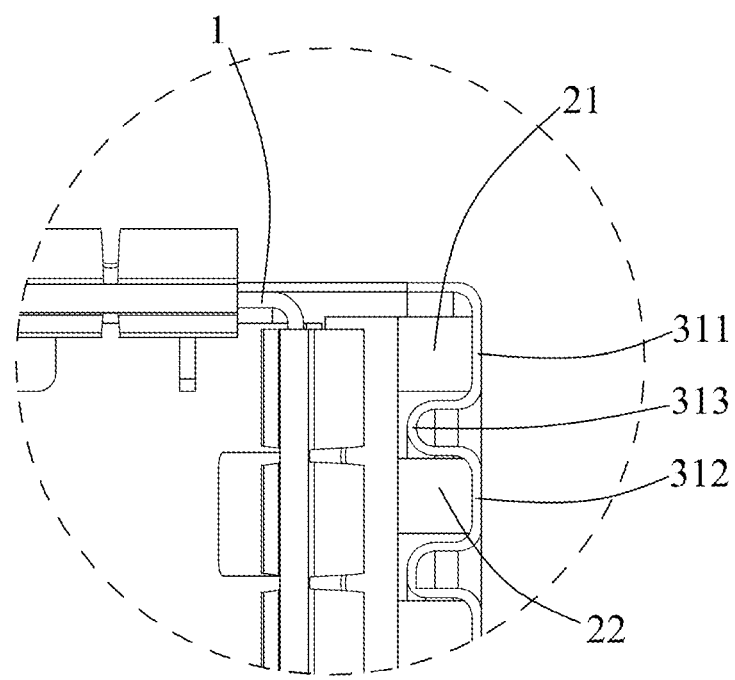
FIG. 9 is a partial enlarged view of FIG. 8.
Figure 10:
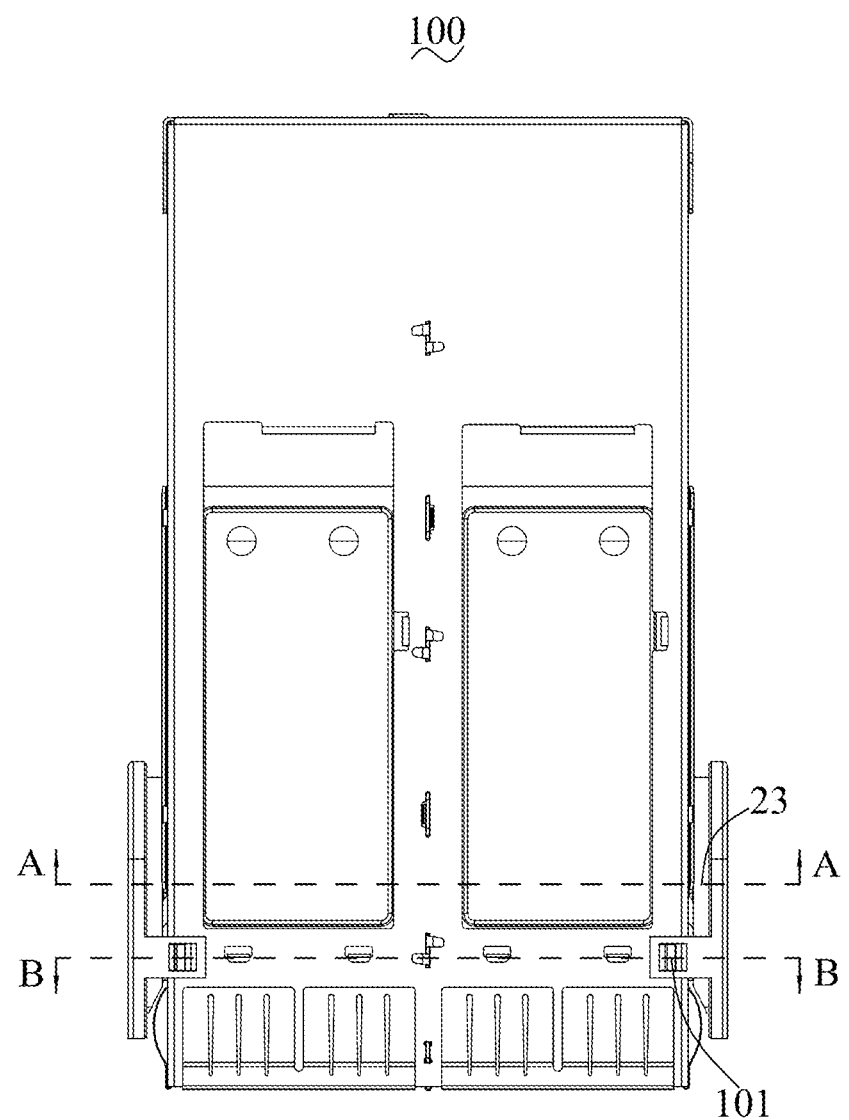
FIG. 10 is a top view of the anti-cross-lighting structure of the present disclosure.
Figure 11:
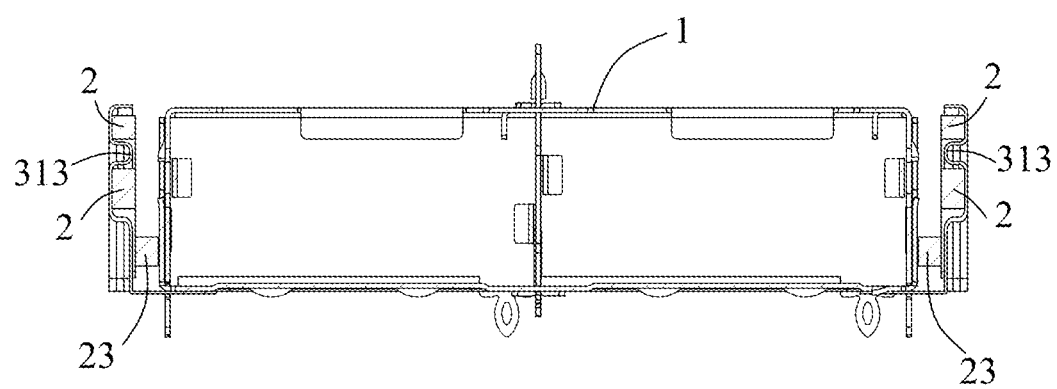
FIG. 11 is a cross-sectional view when taken along line A-A in FIG. 10.
Figure 12:
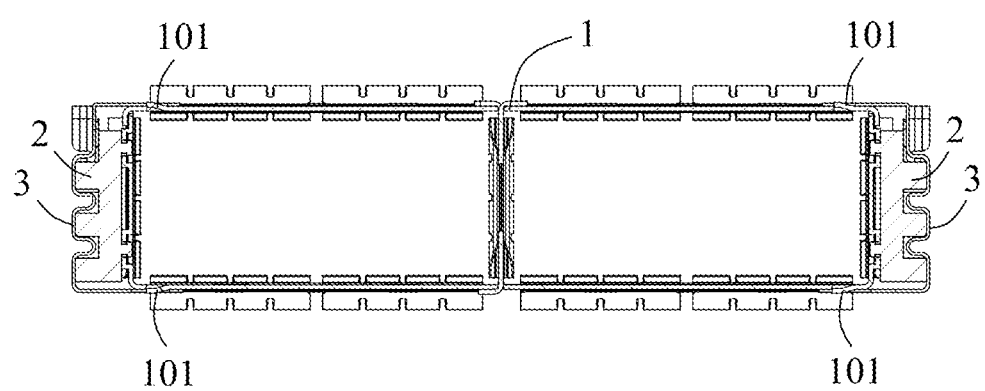
FIG. 12 is a cross-sectional view when taken along line B-B in FIG. 10.

Referring to FIGS. 6 and 7, the first surrounding portion 311 includes a first baffle portion 301, a second baffle portion 302 and a third baffle portion 303. The second baffle portion 302 is located below the first baffle portion 301 and opposite to the first baffle portion 301. The third baffle portion 303 is connected between the first baffle portion 301 and the second baffle portion 302. The first baffle portion 301, the second baffle portion 302 and the third baffle portion 303 together enclose a first receiving space 300 accommodating the first light-guiding pillar 21. The second surrounding portion 312 is located below the first surrounding portion 311. The second surrounding portion 312 has substantially the same shape as the first surrounding portion 311. That is, the second surrounding portion 312 includes a fourth baffle portion 304, a fifth baffle portion 305 and a sixth baffle portion 306. The fifth baffle portion 305 is located below the fourth baffle portion 304 and opposite to the fourth baffle portion 304. The sixth baffle portion 306 is connected between the fourth baffle portion 304 and the fifth baffle portion 305. The fourth baffle portion 304, the fifth baffle portion 305, and the sixth baffle portion 306 together enclose a second receiving space 300' accommodating the second light-guiding pillar 22. The second baffle portion 302 and the fourth baffle portion 304 are arranged face to face and spaced apart from each other. In addition to the second baffle portion 302 and the fourth baffle portion 304, the middle blocking portion 313 also includes a bridge portion 307 connected between the second baffle portion 302 and the fourth baffle portion 304. That is, the first surrounding portion 311, the second surrounding portion 312, and the middle blocking portion 313 are formed in a continuous wave shape.

Referring to FIGS. 6 and 7, the first surrounding portion 311 and the second surrounding portion 312 protrude toward a first direction (a right direction in FIG. 7) while the middle blocking portion 313 protrudes toward a second direction (a left direction in FIG. 7) opposite to the first direction.

The light-guiding elements 2 of the present disclosure include at least one group which are located on the same side of the support frame 1 and arranged in parallel. The anti-cross-lighting structure 100 is provided with the shielding piece 3 covered outside of the light-guiding element 2. The shielding piece 3 includes the middle blocking portions 313 isolating the light-guiding elements 2 which are adjacent to each other so as to avoid the occurrence of cross-lighting. In the present disclosure, the light-guiding elements 2 located on the same side of the support frame 1 are connected into a whole via the beam assembly 234. The present disclosure quickly and stably assembles the light-guiding elements 2 on the support frame 1 via the cooperation between the positioning pins 25 and the positioning holes 102. The shielding piece 3 and the support frame 1 of the present disclosure are clamped to each other and alternatively, the shielding piece 3 and the support frame 1 are screwed to each other by the fastener 4. According to the present disclosure, the shielding piece 3 can be quickly and stably assembled on the support frame 1 through one of the above two methods. Overall, the present disclosure not only avoids cross-lighting effectively, but also has a stable structure. The present disclosure achieves the effects of simple assembly and quick disassembly.

The above embodiments are only used to illustrate the present disclosure and not to limit the technical solutions described in the present disclosure. The understanding of this specification should be based on those skilled in the art. Descriptions of directions, such as "front", "back", "left", "right", "upper" and "lower", although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. An anti-cross-lighting structure, comprising:
a support frame;
a plurality of light-guiding elements located beside the support frame, the light-guiding elements being arranged on a same side of the support frame and forming at least one group; and
a shielding piece, mounted on the support frame and wrapping over the light-guiding elements, the shielding piece comprising a plurality of middle blocking portions, and each middle blocking portion isolating the light-guiding elements which are adjacent to each other.

2. The anti-cross-lighting structure according to claim 1, wherein the light-guiding elements on the same side of the support frame include a first light-guiding pillar and a second light-guiding pillar, the second light-guiding pillar is spaced to the first light-guiding pillar, and the middle blocking portion is located between the first light-guiding pillar and the second light-guiding pillar.

3. The anti-cross-lighting structure according to claim 2, wherein the shielding piece comprises a first surrounding portion accommodating the first light-guiding pillar and a second surrounding portion accommodating the second light-guiding pillar.

4. The anti-cross-lighting structure according to claim 3, wherein the first surrounding portion comprises a first baffle portion, a second baffle portion and a third baffle portion, the first baffle portion, the second baffle portion and the third baffle portion are enclosed to form a first receiving space accommodating the first light-guiding pillar, the second surrounding portion comprises a fourth baffle portion, a fifth baffle portion and a sixth baffle portion, and the fourth baffle portion, the fifth baffle portion and the sixth baffle portion are enclosed to form a second receiving space accommodating the second light-guiding pillar.

5. The anti-cross-lighting structure according to claim 4, wherein the second baffle portion is located below and opposite to the first baffle portion, the fifth baffle portion is located below and opposite to the fourth baffle portion, the third baffle portion is connected between the first baffle portion and the second baffle portion to define the first receiving space, and the sixth baffle portion is connected between the fourth baffle portion and the fifth baffle portion to define the second receiving space.

6. The anti-cross-lighting structure according to claim 5, wherein the middle blocking portion comprises a bridge portion connected between the second baffle portion and the fourth baffle portion.

7. The anti-cross-lighting structure according to claim 3, wherein the first surrounding portion, the second surrounding portion, and the middle blocking portion are formed in a continuous wave shape.

8. The anti-cross-lighting structure according to claim 7, wherein the first surrounding portion and the second surrounding portion protrude toward a first direction while the middle blocking portion protrudes toward a second direction opposite to the first direction.

9. The anti-cross-lighting structure according to claim 1, wherein the shielding piece includes a main portion and a pair of arm portions extending from two ends of the main portion, the main portion wraps over the light-guiding elements, and the arm portions are fixed with the support frame.

10. The anti-cross-lighting structure according to claim 9, wherein the support frame comprises an engaging portion and each arm portion comprises a mating portion clamping with the engaging portion.

11. The anti-cross-lighting structure according to claim 9, further comprising a fastener, each of the arm portion and the support frame comprising a through hole, wherein the fastener passes the through holes of the arm portion and the support frame so as to fix the shielding piece on the support frame.

12. The anti-cross-lighting structure according to claim 9, wherein the light-guiding elements are curved and the main portion is formed with a plurality of curved surrounding structures corresponding to the light-guiding elements.

13. The anti-cross-lighting structure according to claim 12, wherein the support frame comprises a bottom surface for being mounted on a circuit board and a front surface perpendicular to the bottom surface for mating with a mating connector, and each light-guiding element includes a first end portion extending toward the bottom surface and a second end portion extending toward the front surface to form the curved shape.

14. The anti-cross-lighting structure according to claim 1, wherein the support frame comprises a top surface, a bottom surface opposite to the top surface, a front surface, a rear surface opposite to the front surface, a left surface, and a right surface opposite to the left surface, and the light-guiding elements are arranged on at least one of the left surface and the right surface.

15. The anti-cross-lighting structure according to claim 14, wherein the light-guiding elements form two groups and the shielding pieces comprise two shielding pieces corresponding to the two groups of the light-guiding elements, both the light-guiding elements and the shielding pieces are symmetrically arranged on the left surface and the right surface of the support frame.

16. The anti-cross-lighting structure according to claim 1, further comprising a beam assembly, the beam assembly having a first beam and a second beam interlaced with each other, wherein the light-guiding elements on a same surface of the support frame are connected as a whole via the beam assembly.

17. The anti-cross-lighting structure according to claim 16, wherein the beam assembly comprises a plurality of positioning pins and the support frame defines a plurality of positioning holes receiving the positioning pins.

18. The anti-cross-lighting structure according to claim 16, wherein the support frame comprises a plurality of positioning pins and the beam assembly defines a plurality of positioning holes receiving the positioning pins.

19. The anti-cross-lighting structure according to claim 1, further comprising a circuit board and a plurality of light sources installed on the circuit board, wherein the light-guiding elements are correspondingly connected to the light sources.

20. The anti-cross-lighting structure according to claim 19, wherein the light sources are arranged in two rows on the circuit board and are symmetrically located on a left side and a right side of the support frame.

\* \* \* \* \*